United States Patent [19]
Hayashi et al.

[11] Patent Number: 5,838,111
[45] Date of Patent: Nov. 17, 1998

[54] PLASMA GENERATOR WITH ANTENNAS ATTACHED TO TOP ELECTRODES

[75] Inventors: Shigenori Hayashi, Nara; Hideo Nakagawa, Kanagawa, both of Japan

[73] Assignee: Matsushita Electric Industrial Co., Ltd., Japan

[21] Appl. No.: 807,396

[22] Filed: Feb. 27, 1997

[30] Foreign Application Priority Data

Feb. 27, 1996 [JP] Japan ................................ 8-039435

[51] Int. Cl.⁶ .................................................. H05H 1/46
[52] U.S. Cl. ............................... 315/111.21; 315/111.41; 118/723 AN
[58] Field of Search ..................... 315/111.21, 111.41, 315/111.51; 118/723 MA, 723 AN

[56] References Cited

U.S. PATENT DOCUMENTS 4,968,918  11/1990  Kondo et al. .................... 315/111.21

FOREIGN PATENT DOCUMENTS 6-151090  5/1994  Japan ................................ 315/111.41
7-307200  11/1995  Japan .

Primary Examiner—Robert J. Pascal
Assistant Examiner—Justin P. Bettendorf
Attorney, Agent, or Firm—Parkhurst & Wendel

[57] ABSTRACT

A plasma generator operable in the UHF and VHF bands is adaptable to process substrates having different sizes and shapes. The device includes a plurality of electrodes, a power supply for providing a high frequency signal to at least one of the electrodes, and antennas attached to the plurality of electrodes. Antennas on one electrode are arranged substantially parallel and alternately to antennas attached to another adjacent electrode.

22 Claims, 4 Drawing Sheets

PLASMA GENERATOR WITH ANTENNAS ATTACHED TO TOP ELECTRODES

The present invention is directed to a plasma generator, and more specifically, to a plasma generator which generates plasma for processing a surface of a substrate.

BACKGROUND OF THE INVENTION

A substrate surfacing process using high frequency generated plasma is presently utilized in thin film formation, doping processes, and dry etching processes during the manufacturing of semiconductors or liquid crystal devices. Glow discharge in the RF frequency band, for example 13.56 MHz, using parallel electrodes, and electron cyclotron resonance using, for example, 2.45 GHz micro waves introduced by a wave guide and a magnetic field, are well known plasma generating methods that provide high frequency plasma. However, new types of plasma generators are still desired for the purpose of attaining higher precision and better functionality during a surface treatment process. In particular, it is desirable to increase etching rates while at the same time, avoiding damage to substrate surfaces. To this end, there are presently attempts to create inductively coupled or helicon wave excited discharge plasma, high frequency pulse-modulated plasma, and high frequency plasma in the VHF band.

In general, low pressure and high density plasma is required to achieve on the substrate surface highly precise and highly functional results. High density plasma is required for dry etching to increase the number of "species-"including electrons, ions, radicals and atoms, all of which contribute to increasing the overall etching rate. Moreover, it is necessary for the species to collide with the substrate surface as perpendicularly as possible, since a mask pattern is processed or formed perpendicular to that surface. However, there is a high possibility of collision between the various species themselves in an atmosphere of high pressure plasma. Thus it is difficult to maintain, with respect to the collisions of the species with the substrate surface, an appropriate directivity and energy. Low pressure plasma is therefore preferable to decrease the effects caused by residual gas (e.g., $H_2O$ or $O_2$) and collisions between species, whereby reactivity, energy and directivity of the species can be maintained. As a result of providing low pressure plasma, the mask pattern can be processed and formed perpendicular to the substrate surface.

However, even in a low pressure system some of the species may have undesirably high energy, since high a energy must be supplied to generate low pressure and high density plasma. And, those highly energized species may damage the substrate surface, and may destroy effective radicals in the plasma provided for the etching process.

In general, plasma density and ion energy are determined by electron density and electron temperature both of which depend on the frequency of the supplied high frequency signal. Thus, the glow discharge method using a low frequency signal of 13.56 MHz has the following disadvantages. Highly energized species may exist, electric discharge pressure is relatively high, and electron density is relatively low. However, electron temperature is low. On the other hand, the electron cyclotron resonance method using a high frequency of 2.45 GHz has the disadvantage of uniformly high electron temperature. However, the method is also characterized by low pressure electric discharge and high electron density. Furthermore, it is difficult to manufacture an electron cyclotron resonance system for larger substrates because such a system requires increasingly larger circular electric magnets.

According to theory, it is believed that the appropriate frequency band of the high frequency signal which can provide high density and low electron temperature plasma is between about 13.56 Hz to 2.45 Ghz. A preferred plasma density is $10^{11}$–$10^{12}$/cm$^3$ and a preferred electron temperature is less than 3 eV.

Japanese Laid Open Patent Application Hei 7-307200 discloses a plasma generator which can generate plasma by using a high frequency signal of 100 MHz to 1 GHz. An embodiment of an antenna structure for providing a high frequency electric field is disclosed. The antenna structure is positioned in a plasma chamber in which a plasma gas is introduced. FIG. 1 shows a cross sectional view of the antenna structure disclosed in that prior art patent. As shown in FIG. 1, the antenna structure includes a plurality of antennas 30a extending from a center to an outer rim, and a plurality of antennas 30b extending from the outer rim to the center. The antennas 30a and 30b are alternately arranged. The antennas 30a and 30b respectively receive high frequency signals that are phase shifted by 180 degrees with respect to each other. According to the description in the prior art patent, a frequency of the high frequency signal is preferably in the range of about 100 MHz to about 1 GHz, whereby high density and low electron temperature plasma is generated. That reference proposes that a small and practical plasma processing apparatus which effectively and uniformly utilizes VHF band high frequency signals may be realized.

However, since the plasma generator described in the above-cited Japanese laid open patent uses antennas 30a extending from the center to the outer rim and antennas 30b extending from the outer rim to the center, the gap located between the antennas 30a and 30b is not uniform in width. In particular, as shown in FIG. 1, the gap widens towards the outer rim. Therefore, uniform plasma processing is not obtained as the diameter of the circular electrodes increases. When processing a rectangular-shaped substrate such as a liquid crystal display device, the size of the plasma chamber must be large enough to cover the rectangular substrate. Accordingly, it is difficult for the plasma generator described in this reference to perform uniform surface processing.

OBJECTS OF THE INVENTION

It is therefore an object of the present invention to overcome the shortcomings of the prior art as described above, and to provide a plasma generator capable of altering its shape and size depending on the substrate to be processed. It is a further object of the present invention to provide a plasma generator that is operable using a UHF or VHF band high frequency signal.

SUMMARY OF THE INVENTION

In accordance with the present invention, a plasma generator includes a plurality of opposed electrodes, a power supply for providing a high frequency signal to at least one of the electrodes, and antennas attached to the plurality of electrodes. The antennas attached to one electrode are arranged substantially parallel and alternately with antennas attached to other electrodes.

Preferably, the contour shape of at least one of the electrodes is rectangular.

In accordance with one aspect of the invention, the plurality of electrodes are circular, and are arranged in concentric circles, and a gap between two adjacent electrodes is chosen such that one antenna located on one electrode and another antenna located on another electrode are substantially parallel. More specifically, the distance between two adjacent electrodes and the length of antennas are chosen such that the maximum gap and the minimum gap formed between one antenna on one electrode and another antenna on an adjacent electrode is less than 20% of a quarter wave length of the high frequency signal supplied to the electrodes.

In accordance with another aspect of the invention, a high frequency signal of 40 MHz to 1 GHz is preferably supplied to at least one of the electrodes.

Advantageously, at least one electrode is grounded, or, alternatively, one electrode receives a high frequency signal 180 degrees out of phase with respect to another electrode.

In a still further aspect of the invention, an effective distance between the high frequency signal electrode supply point and a distal end of the antennas is equivalent to multiples of a quarter wave length of the supplied high frequency signal.

In still another aspect of the invention, a magnet which supplies a magnetic field perpendicular to an electric field is positioned between adjacent antennas.

In still another aspect of the invention, a plurality of high frequency signals having different phases with respect to each other are supplied to a plurality of points on at least one electrode.

In still another aspect of the invention, the plasma generator includes a power supply for supplying the high frequency signal, and a phase shifting circuit for adjusting the phase of the high frequency signal based on the wave length of the signal and the distance between the high frequency signal supply points.

Still other objects and advantages of the present invention will become readily apparent to those skilled in this art from the following detailed description, wherein we have shown and described only the preferred embodiment of the invention, simply by way of illustration of the best mode contemplated by us of carrying out our invention. As will be realized, the invention is capable of other and different embodiments, and its several details are capable of modifications in various obvious respects, all without departing from the invention. Accordingly, the drawings and description are to be regarded as illustrative in nature, and not as restrictive.

DETAILED DESCRIPTION OF THE PREFERRED EMBODIMENTS OF THE INVENTION

Figure 2:
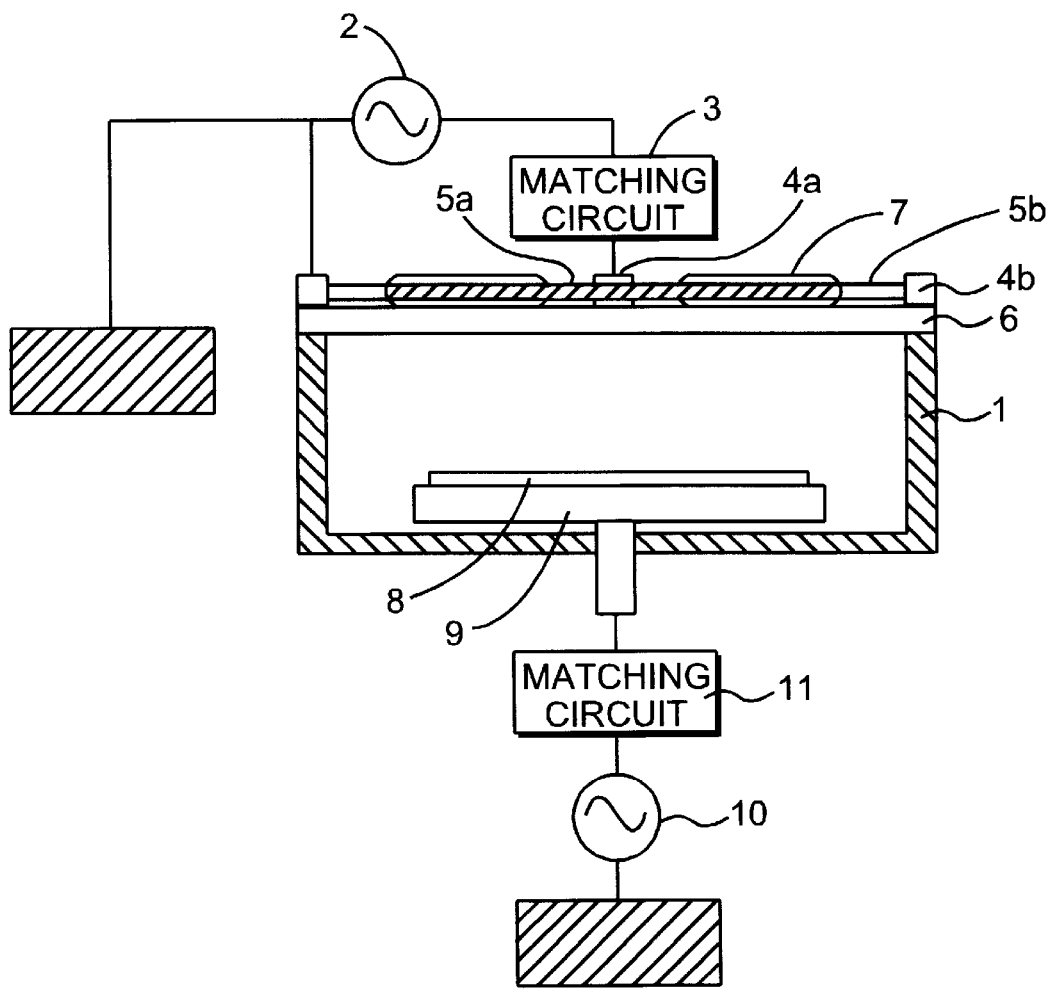
FIG. 2 shows an embodiment of a plasma generator in accordance with the present invention.

A preferred embodiment of the present invention is explained with reference to the accompanying drawings. FIG. 2 shows an embodiment of a plasma generator in accordance with the present invention. The plasma generator includes a plasma chamber 1, a pair of electrodes 4a, 4b, a plurality of antennas 5a, 5b which are disposed parallel with each other on the pair of electrodes 4a, 4b, respectively. The plasma chamber 1 also includes an exhaust system, a gas introduction system, and a substrate carrier chamber (not shown). A high frequency signal from a power supply 2 is coupled to at least one of the electrodes 4a and 4b via a matching circuit 3. The matching circuit 3 is used to adjust the impedance of the electric elements of the plasma generator. It is possible to arrange the electrodes 4a, 4b and the antennas 5a, 5b such that those elements are in contact with the plasma. However, to prevent metal contamination during plasma processing, it is preferred to include insulation 6 to separate the electrodes 4a, 4b and antennas 5a, 5b from the plasma. Moreover, it is also preferred to include permanent magnets 7 between adjacent antennas or adjacent electrodes. A substrate 8 to be processed is positioned in the plasma chamber 1. Radio frequency (RF) signals from an RF power supply 10 are supplied to a substrate electrode 9 via a matching circuit 11. One end of the RF power supply 10 is grounded.

Figure 3:
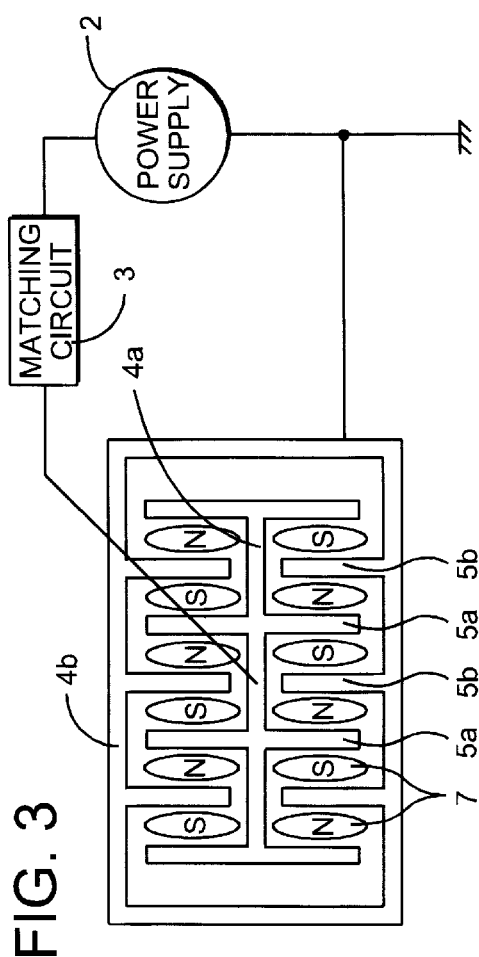
FIG. 3 shows one embodiment of the present invention with an electrode and an antenna structure shown in FIG. 4 shows another embodiment of the present invention with an electrode and an antenna structure shown in FIG. 2.

FIG. 3 shows an embodiment of a structure of the electrodes and antennas used in the present invention. A plurality of antennas 5a are attached to electrode 4a in a comb-like arrangement. Electrode 4b surrounds electrode 4a and the antennas 5a attached thereto, and a plurality of antennas 5b directed inwardly are attached to electrode 4b in a similar comb-like arrangement. Antennas 5a and 5b are thus arranged alternately and parallel with each other. A plurality of permanent magnets 7 are inserted in the gap between antennas 5a and 5b. In this embodiment, electrode 4b is grounded. A high frequency signal from the power supply 2 is introduced at one point, for example the center, of electrode 4a. To provide a stable and uniform high frequency electric field, it is preferred that an effective distance between the point at which the high frequency signal is introduced and a distal end of each antenna 5a is equivalent to multiples of a quarter wave length of the high frequency signal. The effective distance can be based on impedance and reactance values, as well as physcial distance. In accordance with this embodiment, a high frequency signal is supplied only to electrode 4a, and electrode 4b is grounded. However, it is possible to supply 180 degree phase shifted high frequency signals to electrodes 4a and 4b, respectively.

Figure 4:
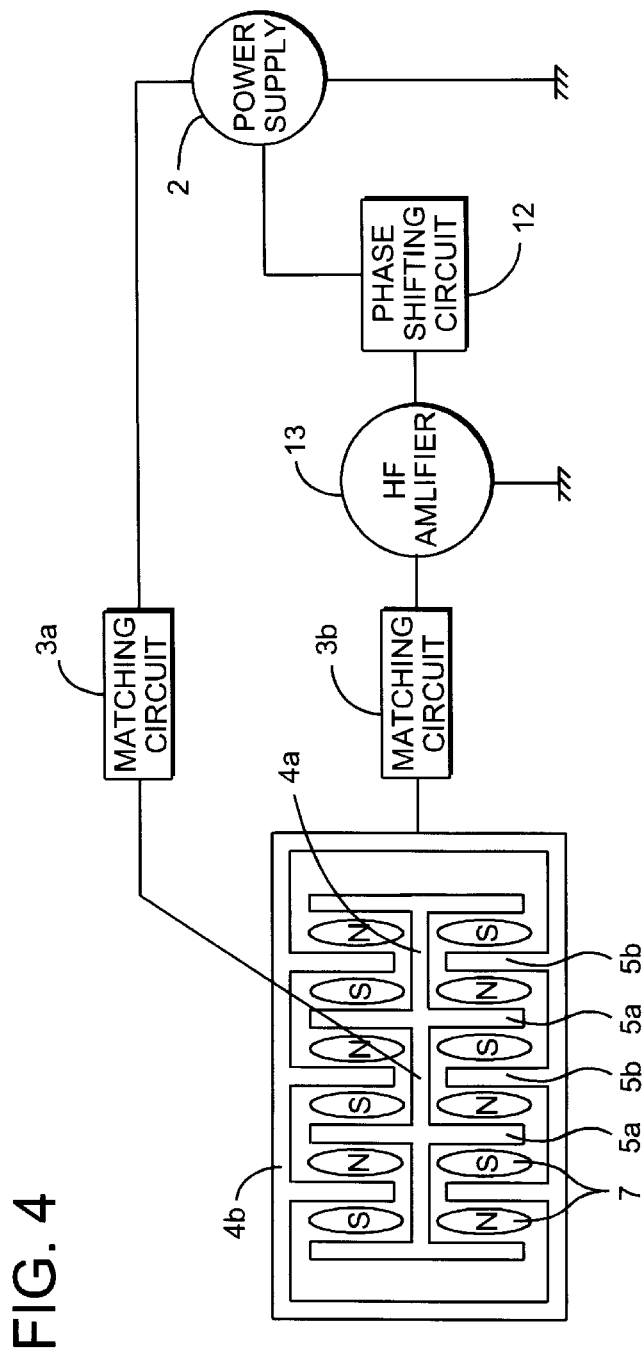

FIG. 4 shows a block diagram depicting a circuit which can supply 180 degree phase shifted high frequency signals to electrodes 4a and 4b, respectively. One output signal from power supply 2 is supplied to a point, e.g. the center, of electrode 4a via matching circuit 3a, and the other output signal from power supply 2 is supplied to one point on electrode 4b via a series circuit comprising a phase shifting circuit 12 which shifts the phase of the high frequency signal by 180 degrees, a high frequency amplifier 13, and a second matching circuit 3b. Consequently, electrode 4b receives a high frequency signal whose phase is shifted 180 degrees with respect to the high frequency signal supplied to electrode 4a.

A frequency range of the high frequency signal from power supply 2 is preferably from 40 MHz to 1 GHz which includes the VHF band (30 MHz to 300 MHz) and UHF band (more than 300 MHz). At those frequencies, it is possible to control the plasma electron temperature and ion density. Furthermore, a quarter wave length of that band (7.5 cm to 187 cm) is convenient in view of the size of the typical substrate being processed. Moreover, in the noted frequency band, the intensity of the magnetic field for electron cyclotron resonance is 13 Gauss to 330 Gauss. And, it is relatively simple to design a permanent magnet having such a magnetic field intensity.

In accordance with the preferred embodiment described above, it is possible to construct a larger plasma generator with a constant gap between antennas 5a and 5b. More specifically, it is possible to provide a plasma generator which is suitable for applying a surface treatment process to a rectangular substrate.

A further embodiment according to the present invention is described below, with reference to FIG. 5. As shown in the figure, electrode 4a has an open rectangle shape having two parallel portions respectively, and antennas 5a are attached to those parallel portions of electrode 4a. Electrode 4b is rectangular and surrounds electrode 4a and antennas 5a. Moreover, an electrode 4b'is attached to a side of the plasma generator which corresponds to an open side of the electrode 4a. Antennas 5b are attached to antennas 4b and 4b'and are arranged parallel and alternately to antennas 5a. Although a permanent magnet is not shown in FIG. 5, it is preferred to have such permanent magnets in the gap formed between facing antennas as in the embodiment shown in FIG. 3. Moreover, it is prefer that that an effective distance between a point where the high frequency signal is introduced and a distal end of each antenna 5a is equivalent to multiples of a quarter wave length of the high frequency signal.

Figure 5:
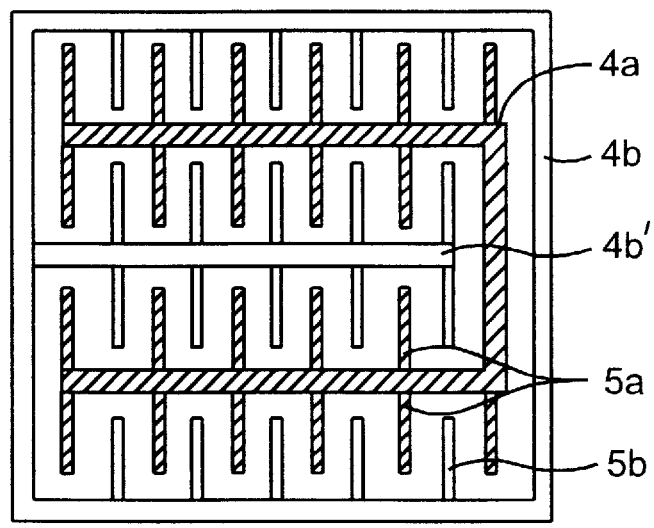
FIG. 5 depicts still another embodiment of an electrode and an antenna structure in accordance with the present invention.

According to the embodiment shown in FIG. 5, it is possible to provide a relatively larger plasma generator. It is also possible to establish more parallel sides of electrodes 4a, and to establish more electrodes 4b'corresponding to the parallel sides of electrodes 4a.

Figure 6:
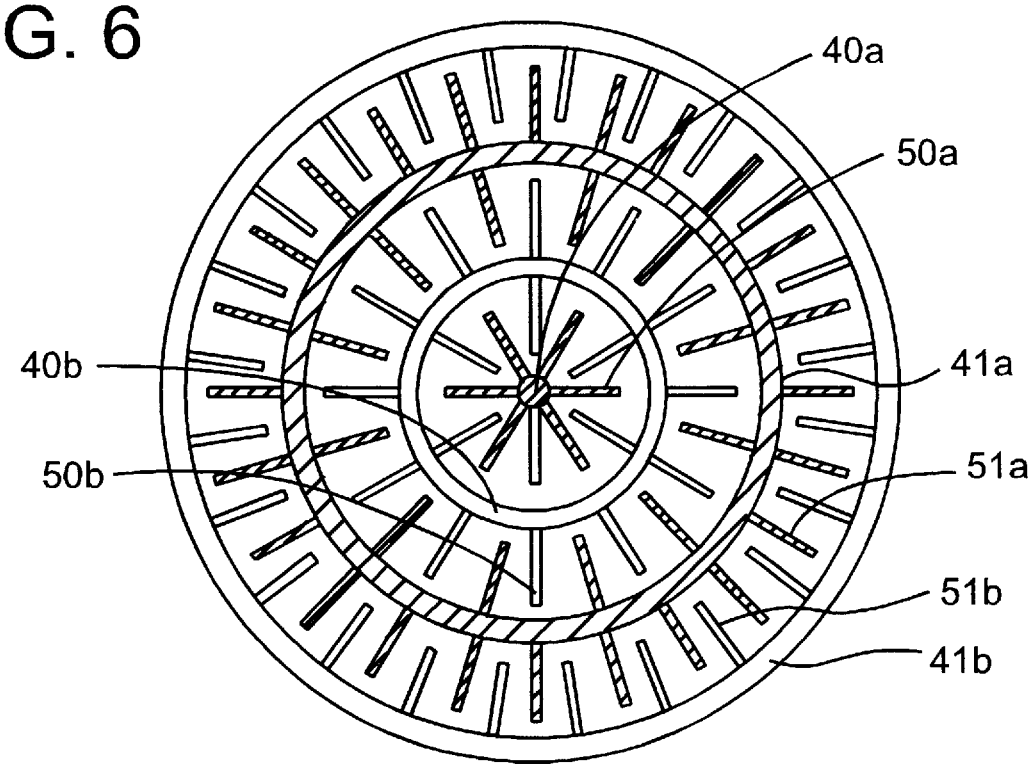
FIG. 6 shows a further embodiment of an electrode and an antenna structure in accordance with the present invention.

Referring next to FIG. 6, a further embodiment of the present invention is described below.

An antenna structure having a plurality of circular electrodes on which a plurality of antennas are attached parallel to and alternately with each other is shown. In particular, a circular electrode 40b is arranged to surround electrode 40a. Similarly, circular electrode 41a is arranged to surround circular electrode 40b, and circular electrode 41b is arranged to surround circular electrode 41a. Each circular electrode has a plurality of antennas 50a, 50b, 51a, 51b, respectively, so that antennas are arranged alternately and substantially parallel with each other. It is of course possible to have additional circular electrodes arranged concentrically.

In the above-described configuration, it is difficult to maintain adjacent antennas in a precisely parallel relationship, since each antenna extends in a radial pattern. However, if the gap between two adjacent electrodes and the length of the antennas are relatively small, it is as if the antennas were substantially parallel. Therefore, it is possible to construct a large scale plasma generator by increasing the number of concentric circular electrodes without increasing the length of the antennas. For example, a distance between two adjacent electrodes and a length of the antennas can be chosen such that both a maximum gap and a minimum gap formed by one antenna on one electrode and another antenna on an adjacent electrode is less than 20% of a quarter wave length of the high frequency signal supplied to the electrode. Furthermore, the number of antennas on an electrode can be increased as the diameter of the electrode increases. Further still, the greater the number of antennas on the circular electrodes, the more the antennas become parallel with each other since the angle formed by adjacent antennas decreases.

Moreover, in the embodiment shown in FIG. 6, the high frequency signal is supplied to at least one point on electrodes 40a and 41a. Electrodes 40b and 41b are grounded, or receive a high frequency signal whose phase is shifted 180 degrees with respect to the phase of the high frequency signal supplied to electrodes 40a and 41a. It is preferred that an effective distance between a high frequency signal electrode supply point and a distal end of the antennas is equivalent to multiples of a quarter wave length of the high frequency signal.

It is also possible to supply high frequency signals having different phases to two or more points on an electrode.

Figure 7:
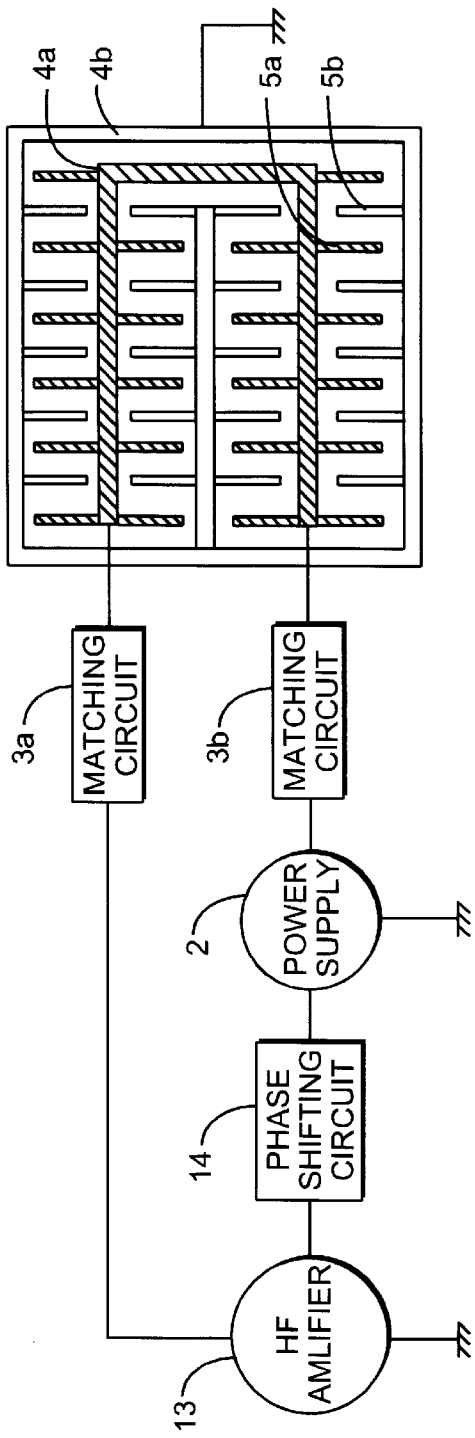
FIG. 7 shows yet another embodiment of the present invention.
Figure 1:
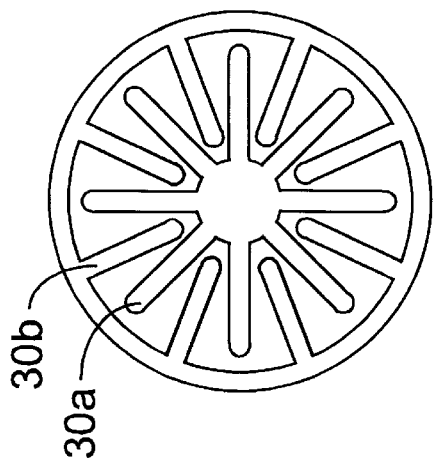
FIG. 1 shows a conventional antenna structure of a plasma generator.

Referring to FIG. 7, the high frequency signal is supplied to both ends of electrode 4a. However, at least one phase of the high frequency signal is adjusted by a phase shifting circuit 14. The phase shifting circuit 14 adjusts the phase of the high frequency signal in accordance with the wave length of the high frequency signal and the distance between the high frequency signal supply points. That is, the phase shifting circuit 14 can adjust the phase of the high frequency signal in accordance with the respective positions of the high frequency signal supply points. The number of supply points need not be limited to only two points. Indeed, the high frequency signals can be supplied at a plurality of points. In that case, phase shifting circuit 14 is employed further to adjust the phase for each supply point. Of course, each of the plurality of supply points should preferably be located in accordance with the quarter wavelength multiple distance.

Thus, for example, if a phase difference between two supply points is $\phi$, phase shifting circuit 14 may shift the high frequency signal by $\phi$. Further, if a third supply point is located between those two supply points, phase shifting circuit 14 may shift the high frequency signal in accordance with an effective distance from the first or second supply point. For example, if the third supply point is located at the center of the first and second supply points, phase shifting circuit 14 may shift the high frequency signal by $\frac{1}{2}\phi$.

In view of the embodiments of the present invention described above, there is flexibility in the number of electrodes and antennas employed in the plasma generator. Therefore, the number of electrodes and antennas can be chosen depending on the shape or size of a substrate to be processed.

According to the present invention, since a plurality of antennas are attached alternately and substantially parallel with each other on at least a pair of electrodes, a large scale plasma generator can be achieved by increasing the number of electrodes. Moreover, it is possible to provide a plasma generator which is suited to the particular size or shape of a substrate to be processed.

We claim:

1. A plasma generator comprising:

a plasma chamber;

a substrate electrode located in said plasma chamber, wherein a surface of any substrate placed on said substrate electrode is exposed to plasma;

a top electrode facing said substrate electrode, said top electrode comprising more than two concentric circular electrodes on a single plane;

antennas attached to each of said circular electrodes, wherein the antennas attached to one of said plurality of circular electrodes are alternately arranged substantially parallel to the antennas attached to another of said circular electrodes; and a power supply for supplying a high frequency signal to at least one of said circular electrodes.

2. The plasma generator of claim 1, wherein said top electrode is located on top of said plasma chamber.

3. The plasma generator of claim 1, further comprising an insulating layer located between said plasma chamber and said top electrode.

4. The plasma generator of claim 1, wherein a maximum gap formed by said one antenna attached to one electrode and said another antenna attached to an adjacent electrode is less than 20% of a quarter wave length of a high frequency signal supplied to said at least one of said electrodes.

5. The plasma generator of claim 1, wherein said power supply is capable of supplying a high frequency signal whose frequency is about 40 MHz to 1 GHz.

6. The plasma generator of claim 1, wherein at least one of said electrodes is grounded.

7. The plasma generator of claim 1, wherein one of said electrodes is connected to receive said high frequency signal, and another of said electrodes is connected to receive, with respect to said high frequency signal, a 180 degree phase shifted high frequency signal.

8. The plasma generator of claim 1, wherein an effective distance between a high frequency signal electrode supply point and a distal end of each of said antennas is equivalent to a multiple of a quarter wavelength of said high frequency signal.

9. The plasma generator of claim 1, further comprising a magnet positioned between alternate antennas, for providing a magnetic field perpendicular to an electric field formed by said electrodes and power supply.

10. A plasma generator comprising:

a plasma chamber;

a substrate electrode located in said plasma chamber, wherein a surface of any substrate placed on said substrate electrode is exposed to plasma;

a top electrode facing said substrate electrode, said top electrode comprising a plurality of electrodes arranged in a rectangular contour shape on a single plane;

antennas attached to each of said plurality of electrodes, wherein the antennas attached to one of said plurality of electrodes are alternately arranged substantially parallel to the antennas attached to another of said plurality of electrodes; and a power supply for supplying a high frequency signal to at least one of said plurality of electrodes.

11. A method of generating plasma with a high frequency signal, comprising the steps of:

providing a top electrode and substrate electrode, wherein said substrate electrode is located in said plasma chamber, and said top electrode faces said substrate electrode and comprises a plurality of electrodes arranged in a rectangular contour shape on a single plane;

providing antennas attached to each of said plurality of electrodes, wherein the antennas attached to one of said plurality of electrodes are alternately arranged substantially parallel to the antennas attached to another of said plurality of electrodes;

providing a substrate placed on said substrate electrode; and supplying a high frequency signal to said top electrode, whereby plasma is generated in said chamber and a surface of said substrate is exposed to said plasma.

12. A method of generating plasma with a high frequency signal, comprising the steps of:

providing a top electrode and substrate electrode, wherein said substrate electrode is located in said plasma chamber, and said top electrode faces said substrate electrode and comprises more than two concentric circular electrodes on a single plane;

providing antennas attached to each of said circular electrodes, wherein the antennas attached to one of said plurality of circular electrodes are alternately arranged substantially parallel to the antennas attached to another of said circular electrodes;

providing a substrate placed on said substrate electrode; and supplying a high frequency signal to said top electrode, whereby plasma is generated in said chamber and a surface of said substrate is exposed to said plasma.

13. The method of claim 12, wherein a maximum gap formed between one antenna on one electrode and another antenna on another adjacent electrode is less than 20% of a quarter wavelength of said supplied high frequency signal.

14. The method of claim 12, wherein the frequency of said high frequency signal is about 40 MHz to 1 GHz.

15. The method of claim 12, further comprising grounding one of said electrodes.

16. The method of claim 12, further comprising supplying to another of said electrodes a second high frequency signal that is 180 degrees shifted in phase with respect to said first-mentioned high frequency signal.

17. The method of claim 12, further comprising supplying said high frequency signal to said at least one electrode at a point that is equivalent to a multiple of a quarter wavelength away from a distal end of any of said antennas.

18. The method of claim 12, further comprising providing a magnet between alternate antennas.

19. A plasma generator, comprising:

a plurality of electrodes;

a power supply for supplying a high frequency signal to at least one of said electrodes; and antennas attached to each of said electrodes, wherein the antennas attached to one of said electrodes are alternately arranged substantially parallel to the antennas attached to another of said electrodes, and wherein at least one of said electrodes comprises a plurality of connection points each connected to receive one of a plurality of high frequency signals each having different phases with respect to each other.

20. The plasma generator of claim 19, further comprising a phase shift circuit for adjusting a phase of said plurality of high frequency signals in accordance with a wavelength of said high frequency signal and a distance between said supply points.

21. A method of generating plasma with a high frequency signal, comprising the steps of:

providing a plurality of electrodes having antennas attached to each of said electrodes such that said antennas are alternately arranged substantially parallel to each other; and supplying a plurality of high frequency signals, each having different phases with respect to each other, to a plurality of supply points on at least one of said electrodes, respectively.

22. The method of claim 21, further comprising the step of adjusting the phase of said plurality of higher frequency signals in accordance with the wavelength of said high frequency signals and a distance between said supply points.

* * * * *